(12) United States Patent
Vergis et al.

(10) Patent No.: US 10,969,974 B2
(45) Date of Patent: Apr. 6, 2021

(54) POWER-BASED DYNAMIC ADJUSTMENT OF MEMORY MODULE BANDWIDTH

(71) Applicant: Intel Corporation, Santa Clara, CA (US)

(72) Inventors: George Vergis, Portland, OR (US); Douglas Heymann, Hillsboro, OR (US); Dat Le, Tigard, OR (US); John Goles, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 279 days.

(21) Appl. No.: 16/112,461

(22) Filed: Aug. 24, 2018

(65) Prior Publication Data

US 2019/0042121 A1     Feb. 7, 2019

(51) Int. Cl.
   *G11C 7/04*          (2006.01)
   *G06F 3/06*          (2006.01)
   *G06F 13/16*         (2006.01)
   *G11C 11/4074*       (2006.01)
   *G11C 5/14*          (2006.01)

(52) U.S. Cl.
   CPC .......... *G06F 3/0629* (2013.01); *G06F 3/0604* (2013.01); *G06F 3/0673* (2013.01); *G06F 13/16* (2013.01); *G11C 5/14* (2013.01); *G11C 7/04* (2013.01); *G11C 11/4074* (2013.01)

(58) Field of Classification Search
   CPC .... G06F 3/0629; G06F 3/0604; G06F 3/0673; G06F 13/16; G11C 5/14; G11C 7/04; G11C 11/4074
   See application file for complete search history.

(56) References Cited

U.S. PATENT DOCUMENTS

| | | | |
|---|---|---|---|
| 7,099,794 B2* | 8/2006 | LeClerg et al. | G06F 3/0604 365/211 |
| 7,277,011 B2* | 10/2007 | Estakhri | G06F 3/16 365/211 |
| 7,984,250 B2* | 7/2011 | Steinbrecher et al. | G06F 3/0673 365/211 |
| 8,055,922 B2* | 11/2011 | Brittain et al. | G06F 3/0629 365/211 |

\* cited by examiner

*Primary Examiner* — Pho M Luu
(74) *Attorney, Agent, or Firm* — Schwabe, Williamson & Wyatt, P.C.

(57) ABSTRACT

A memory controller includes a sensor poller and a proportional integral controller (PIC) coupled to the sensor poller. The sensor poller is to obtain a temperature and a power of a memory module (MM) operated by the controller, and the PIC is to: dynamically set at least one bandwidth limit for the MM, based, at least in part, on a relationship between a temperature of the MM, a power of the MM and a bandwidth of the MM. The dynamically set bandwidth limit defines the power of the MM at which the MM operates for a predetermined temperature limit. A system includes a memory controller and a dual in-line memory module (DIMM) operated by it.

17 Claims, 10 Drawing Sheets

POWER-BASED DYNAMIC ADJUSTMENT OF MEMORY MODULE BANDWIDTH

FIELD

Embodiments of the present disclosure relate to control of memory modules and in particular to dynamically adjusting dual in-line memory module (DIMM) bandwidth based on power telemetry.

BACKGROUND

A DIMM comprises a series of dynamic random-access memory (DRAM) integrated circuits. These modules are mounted on a printed circuit board and designed for use in computing systems such as personal computers, workstations and servers. DIMMs are the predominant type of memory module in current computing systems. It is known that managing the temperature of DIMMs is critical to preventing loss of data or system crashes. To facilitate such management, DIMMs are provided with temperature sensors, which are read by a central processing unit (CPU) of the computing system. The CPU is responsible for throttling requests to the DIMM in order to reduce the memory temperature when it begins to enter a high temperature range. A conventional approach to thermal management of DIMMs is to use a "hammer condition" (a static either/or binary rule). A memory controller continually polls a temperature sensor on the DIMM. Upon nearing a maximum DRAM temperature (Tset or $T_{LIMIT}$), the memory controller limits bandwidth to 5-10%. Once DRAM temperature has fallen below $T_{LIMIT}$, the controller removes the bandwidth limitation.

DETAILED DESCRIPTION

The embodiments described herein provide apparatus, computer readable media and methods for thermal management of a memory module (MM) of a computing system, the MM operated by a memory controller. In embodiments, the memory controller includes a sensor poller and a proportional integral controller (PIC) coupled to it. The sensor poller is to obtain a temperature of the MM and a power of the MM, and the PIC is to dynamically set at least one bandwidth limit for the MM, based, at least in part, on a relationship between a temperature of the MM, a power of the MM and a bandwidth of the MM. In embodiments, the dynamically set bandwidth limit defines the power of the MM at which the MM operates for a predetermined temperature limit. In embodiments, a system includes a memory controller, and a DIMM operated by the memory controller.

In embodiments the MM is a DIMM that includes both one or more temperature and one or more power sensors, and the controller uses a control algorithm that accounts for various power to bandwidth differences between DIMM types and DIMM vendors without the need for lookup tables. In embodiments, the MM further includes a data consolidation hub to interface between sensors of the DIMM and a host computer.

In embodiments, dynamic modulation of bandwidth limits based on power-temperature correlation enables a memory controller to operate a MM at bandwidth levels significantly greater than the standard fixed 5-10% static bandwidth limitations described above. Moreover, in embodiments, the memory controller may utilize an existing DIMM power meter, which obviates the need for a platform DIMM power meter, thereby reducing system cost.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, including in the claims, the term "chip" may refer to a physical integrated circuit (IC) on a computer. A chip in the context of this document may thus refer to an execution unit that can be single-core or multi-core technology.

As used herein, including in the claims, the term "processor" may refer to a logical execution unit on a physical chip. A multi-core chip may have several cores. As used herein the term "core" may refer to a logical execution unit containing an L1 (lowest level) cache and functional units. Cores are understood as being able to independently execute programs or threads.

Figure 1:
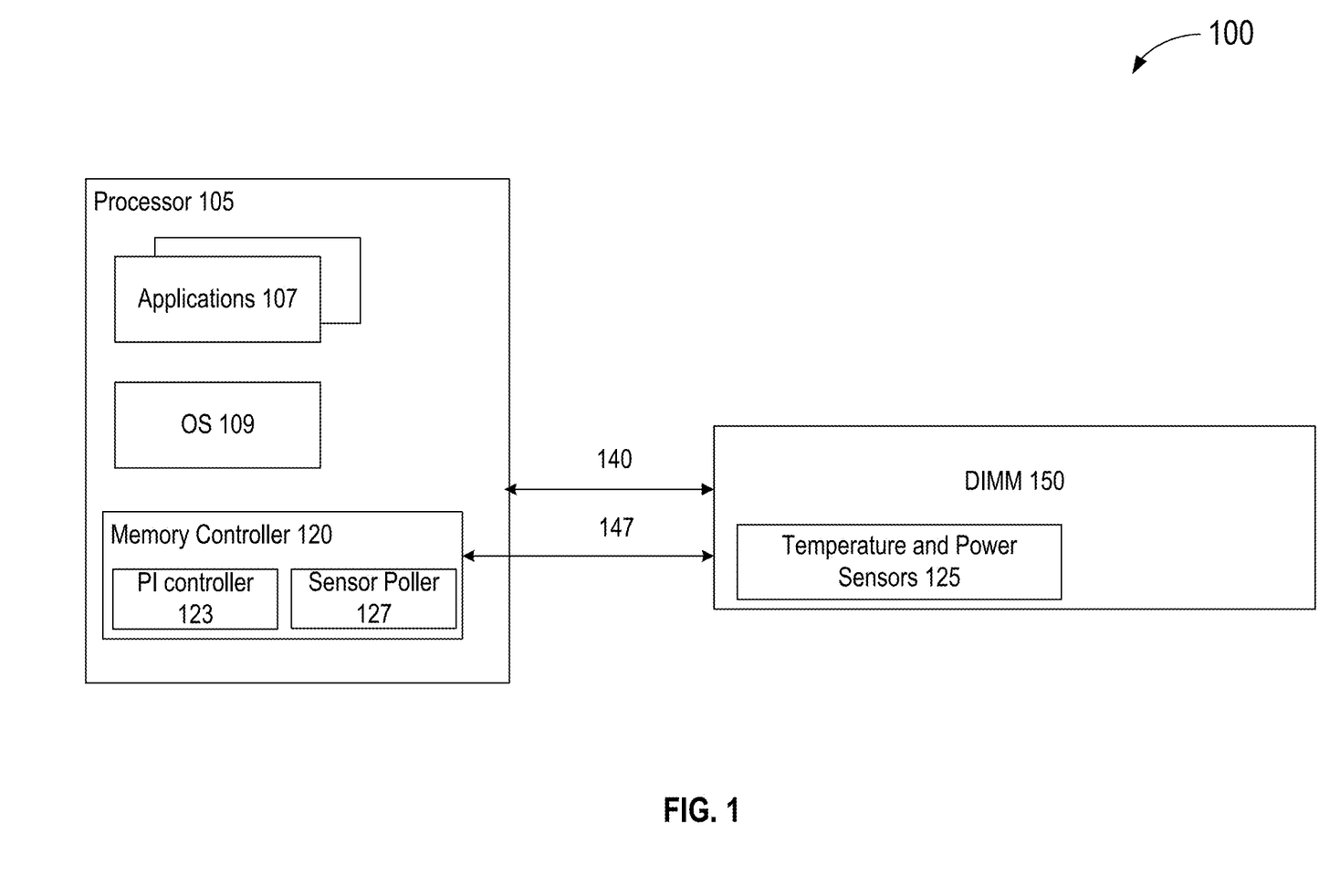
FIG. 1 illustrates a functional block diagram of a computing system including a memory controller and a DIMM, in accordance with various embodiments.

FIG. 1 illustrates an example computer system 100 with power based dynamic adjustment of memory module bandwidth, in accordance with various embodiments. With reference to FIG. 1, the example computer system includes processor 105, which may run one or more applications 107. Processor 107 may further be running operating system (OS) 109. Moreover, processor 105 may be coupled to DIMM 150, over bus 140. Although only one DIMM is shown in FIG. 1, this is understood to be representative only, and, in embodiments, there may be (and generally are) several DIMMs in system memory, all of which are controlled according to various embodiments. Further, DIMM 105 includes temperature and power sensors 125. DIMM 150 is operated by memory controller 120, which is coupled to DIMM 105 over control bus 147. As shown, memory controller 120 is integrated within processor 105. However, in alternate embodiments, memory controller 120 may be, or may be a part of, a separate element of computer system 100. In embodiments, memory controller 102 may, for example, be integrated with a memory board, on which several DIMMs are provided. Memory controller 120 includes sensor poller 127, which may periodically poll temperature and a power sensors 125 of DIMM 150. Memory controller 120 also includes PIC 123 which thermally manages DIMM 150 based on the temperature and power data obtained by sensor poller 127. PIC 123 also issues control signals, over control bus 147, to limit the bandwidth of DIMM 150, as described more fully below. The frequency at which sensor poller 123 polls temperature and power sensors 125 will generally vary with the type of DIMM, the workload it is being put to, and a power to bandwidth relationship of the DIMM.

Figure 2:
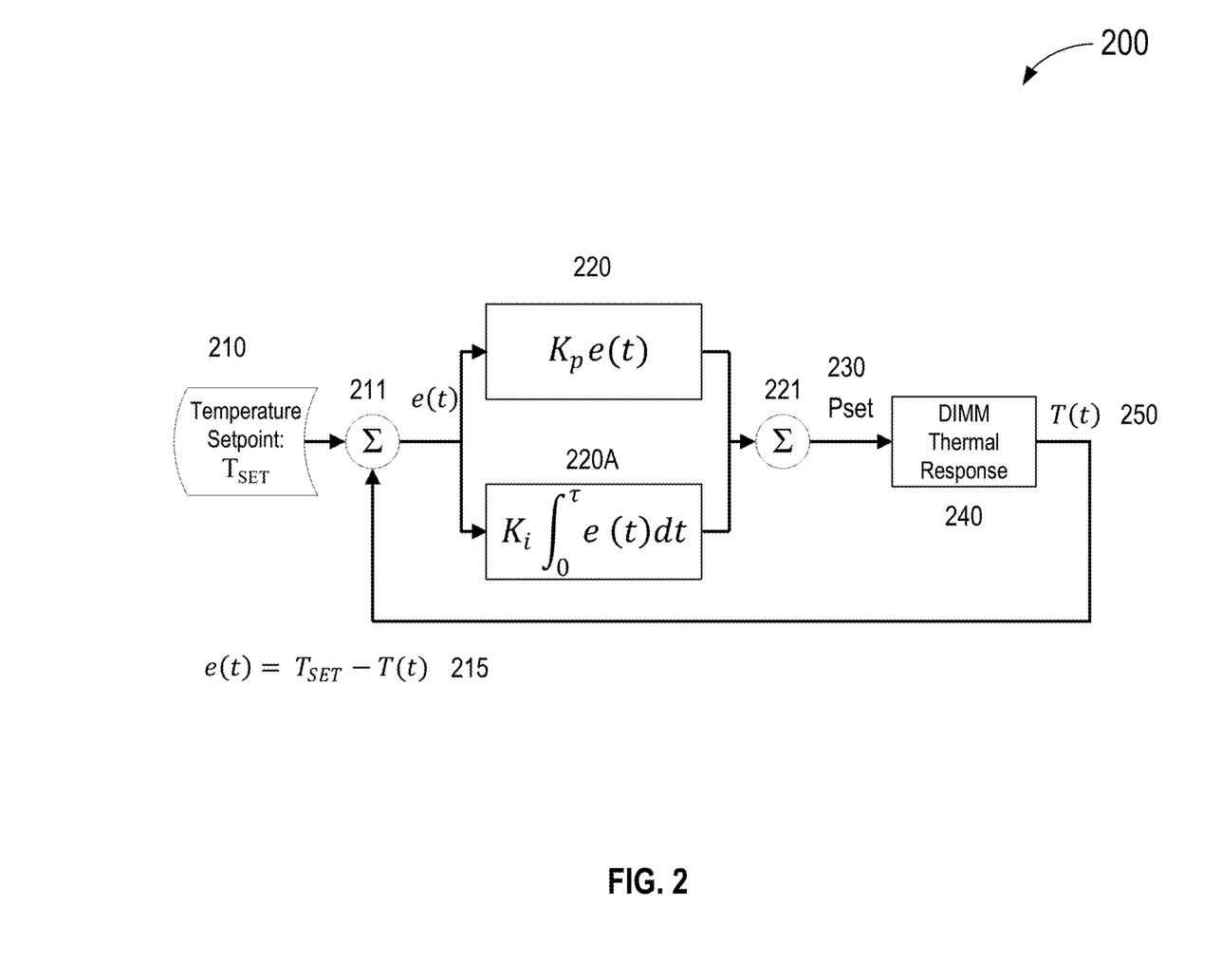
FIG. 2 illustrates an outer loop of an example control algorithm that dynamically associates a power output with a maximum temperature input, in accordance with various embodiments.
Figure 3:
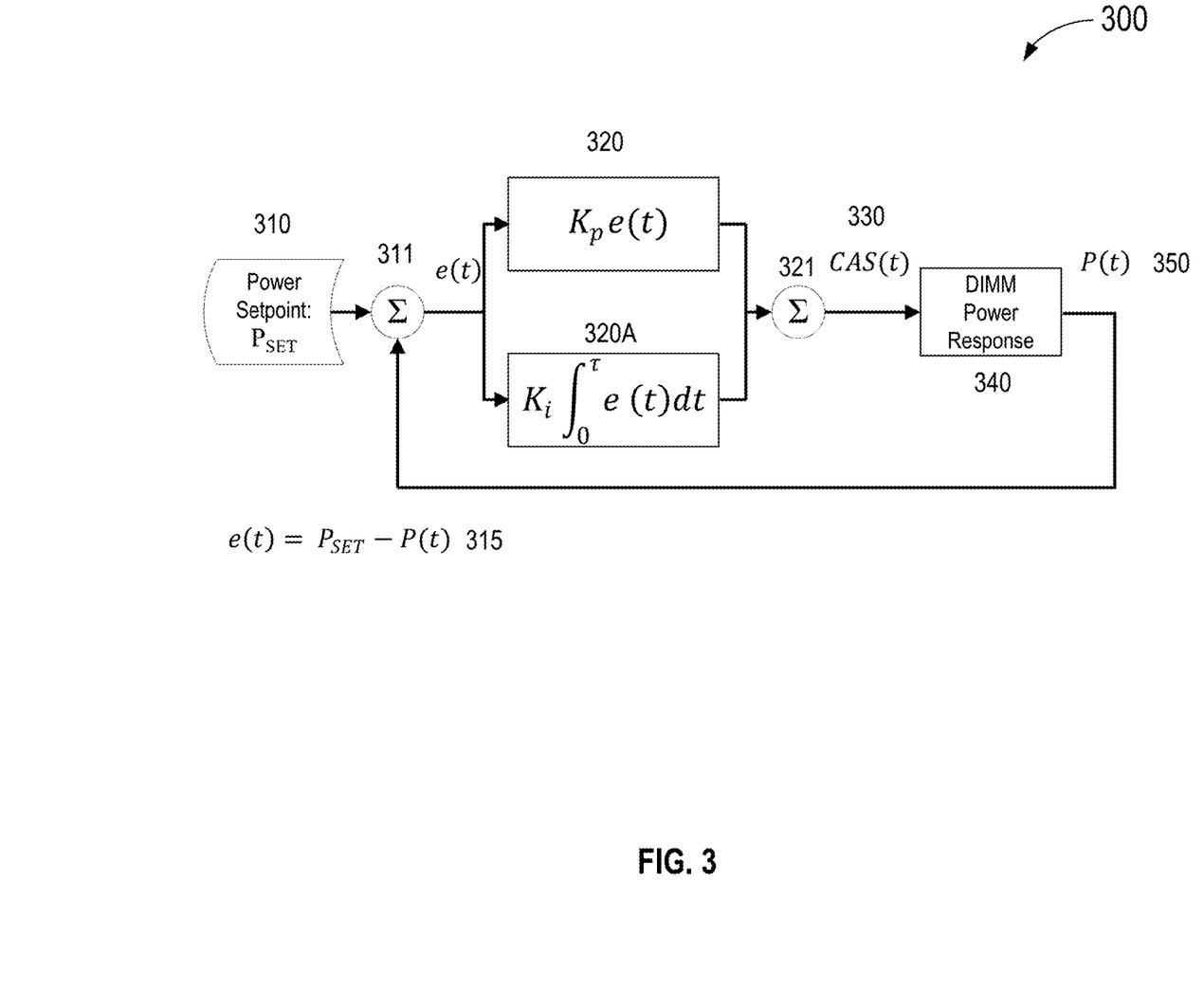
FIG. 3 illustrates an inner loop of an example control algorithm that dynamically associates a bandwidth limit output with a maximum power input, in accordance with various embodiments.

In embodiments, unlike the conventional binary either/or control algorithms that are often used to thermally manage memory modules, PIC 123 dynamically thermally manages DIMM 150 using two nested PI control loops. PI control is a control loop feedback mechanism that provides continually modulated control. As shown in FIGS. 2 and 3, a PIC calculates an error value e(t) as the difference between a desired set point of a "process variable" (e.g., temperature of a DIMM) and a measured value of that process variable. It then applies a correction to the error function by summing a proportional term and an integral term that each operate on the error function, hence the name "proportional integral controller." A PIC minimizes the error over time by adjusting what is known as a "control variable", e.g., power consumed by a DIMM, to a new value that is determined by a weighted sum of the proportional and integral terms of the error function.

Figure 4:
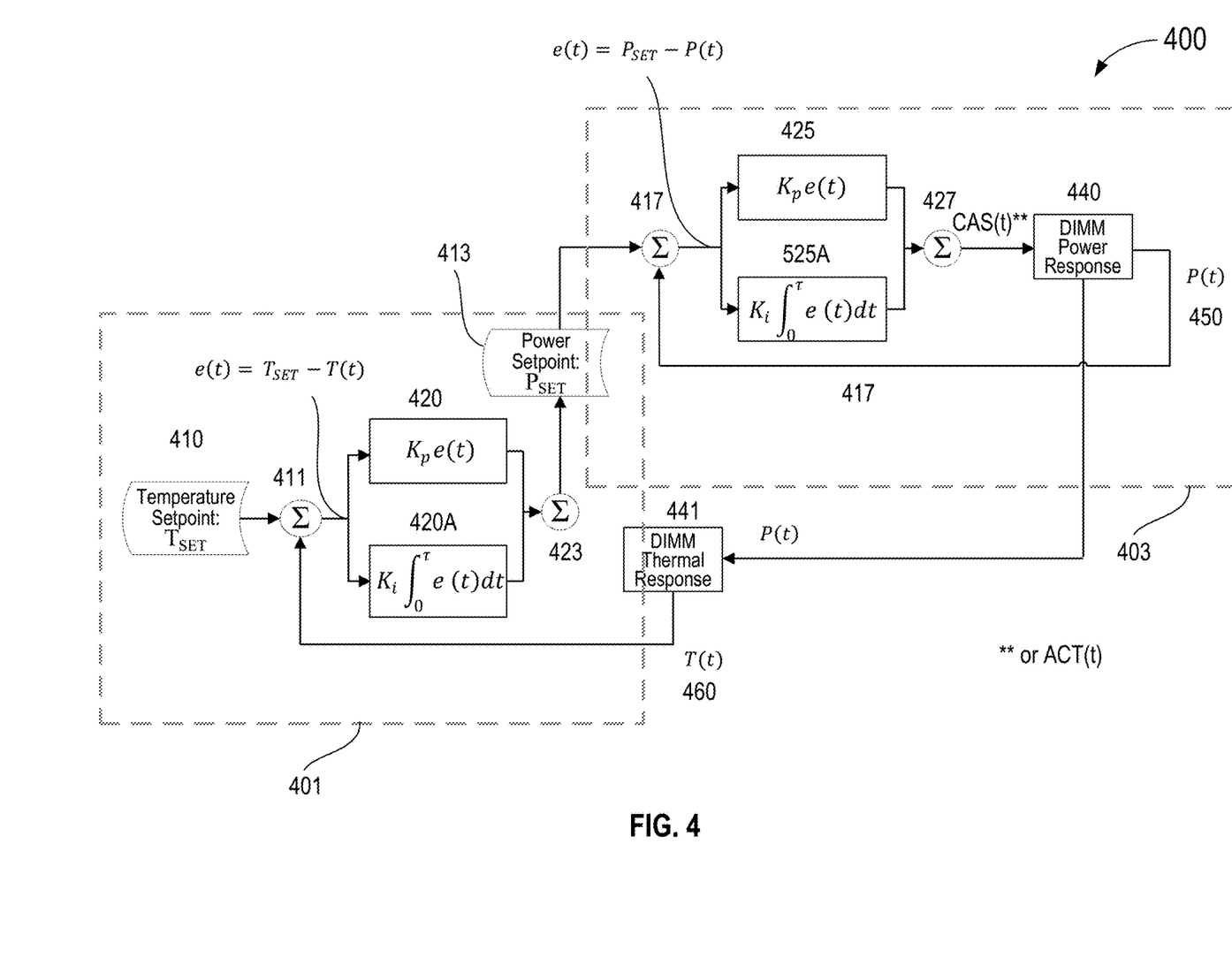
FIG. 4 illustrates a control algorithm that includes a nested version of the two control loops shown in FIGS. 2 and 3, which dynamically associates a bandwidth limit output with a maximum temperature input, in accordance with various embodiments.

In embodiments, an outer PI control loop determines a power (Pset) for the DIMM as a function of a $T_{LIMIT}$ input as the set point (Tset), and an inner PI control loop determines a maximum bandwidth for the DIMM as a function of Pset as determined by the outer control loop. In what follows, the outer PI control loop is described with reference to FIG. 2, and the inner PI control loop is described with reference to FIG. 3. FIG. 4, described below, illustrates the combined nested version of the two control loops of FIGS. 2 and 3, according to various embodiments.

Continuing with reference to FIG. 2, beginning at the left of the figure, a temperature set point (Tset) 210 is input to the PI control algorithm. In embodiments, Tset is equal to $T_{LIMIT}$ described above, and refers to the maximum temperature that a DIMM should operate at. In the nomenclature of PI control, an input to a PI control loop is known as a "set point,", and its variable is the one the error function is calculated for. Thus, for purposes of FIGS. 2 and 4, the term "Tset" is used, it being understood that it is the same value as "Tlimit" described above, which is the nomenclature usually used in describing thermal management of memory modules. As noted above, once the DIMM's temperature reaches $T_{LIMIT}$, the DIMM's bandwidth must be limited so as to cool it down.

Continuing with reference to FIG. 2, Tset is combined at summation node 211 with T(t), the dynamic temperature of the DIMM as output at 250 on the far right of the figure. Summation node 211 calculates the error value of the temperature, e(t)=Tset−T(t), as shown at 215. E(t) is then input to both the proportional 220 and the integral 220A arms of PI control loop 200, as shown, to obtain the proportional and integral terms. Coefficients Kp and Ki of the proportional 220 and integral 220A terms, respectively, are constants that may be determined empirically. For example, to compute these coefficients, a sample of DIMM traffic, as well as DIMM power, is needed. A non-linear least-squares residual analysis may then be performed in order to find the optimum coefficient that results in the fastest response to meet the target power and temperature.

Continuing with reference to FIG. 2, the outputs of each of the proportional 220 and integral 220A arms of PI control loop 200 are then summed at summing node 221. The output of summing node 221 yields Pset, which is the (maximum) power at which the DIMM may operate at time t so as to satisfy the control loop input Tset. As shown, Pset 230 is then input to DIMM thermal response 240, which provides the corresponding temperature T(t) of the DIMM operating at the power Pset. The thermal response may be thought of as a heater. A certain amount of power is put into the DIMM, and the subsequent temperature is a result of how "powerful" that heater is. As shown, T(t) is fed back to summing node 211 to calculate e(t) once again in another iteration of the PI control loop.

FIG. 3 illustrates the inner PI control loop, in accordance with various embodiments. Control loop 300 of FIG. 3 has the same structure as that of 200 of FIG. 2, but has a different input variable (Pset) and outputs a bandwidth limit variable of the DIMM as opposed to a power of the DIMM, as in FIG. 2. In embodiments, the bandwidth limit variable may be, for example, one or both of CAS(t) or ACT(t), described below.

Continuing with reference to FIG. 3, beginning at the left of the figure, a power set point (Pset) 310 is input to the control algorithm. In embodiments, Pset is equal to the control variable Pset found by PI control loop 200 of FIG. 2, for a given temperature set point Tset, at a given time (because the bandwidth of the DIMM is always changing, P(t) is also always changing). Pset refers to the maximum power that the DIMM may consume to still operate at Tset, at any given point in time. Using Pset as an input, a bandwidth limiting control variable CAS(t) may be calculated, as shown at 330, to limit the power consumed by the DIMM. Additionally, in embodiments, a second PI inner control loop (not shown) may also be used, in the exact same manner, to generate another bandwidth limiting control variable, ACT(t). CAS refers to the number of column access strobes of a memory module per unit time, and ACT refers to the number of row activations of the memory module per unit time, each of which is a measure of bandwidth. By limiting one or both of those values, power consumption of the DIMM, and thus its temperature, is also limited. Limiting CAS generally has a greater effect. In embodiments, one or both CAS(t) and ACT(t) may be limited for a DIMM.

Continuing with reference to FIG. 3, CAS(t), which is the "control variable" of the inner PI loop, is input to DIMM power response 340, which outputs P(t), which is the "process value" of the inner PI loop (e.g., the variable whose error function is calculated and used as the input to the proportional and integral arms of the PI control loop). The power response refers to how much power the DIMM needs to perform, for example, the number of CAS commands (or, in an ACT based control loop, the number of ACT commands) in the system. That power is converted to heat, which is how the CAS value (or ACT value, in an ACT based control loop) is connected to the temperature P(t) is then fed back to summation 311 where $e(t)=P_{SET}-P(t)$ is once again calculated, thus initiating another iteration of the inner control loop.

Thus, in embodiments, by dynamically applying bandwidth limits, in the form of limits on CAS(t) and ACT(t), to the DIMM, its temperature may be dynamically adjusted to both remain below $T_{LIMIT}$, but also, in contrast to conventional thermal management methods, to fluctuate as may be possible without exceeding $T_{LIMIT}$.

Accordingly, in embodiments, a memory controller may implement an overall control algorithm, based upon both PI control loops described above, as follows. The memory controller periodically measures both temperature ($T_{DIMM}$) and power consumption ($P_{DIMM}$) of the DIMM. As $T_{DIMM}$ nears $T_{LIMIT}$, the controller uses the outer PI loop of FIG. 2 to determine a target power consumption ($P_{DIMM, target}$) necessary to satisfy $T_{DIMM}=T_{LIMIT}$. Then, using the inner PI loop of FIG. 3, the memory controller dynamically modulates ACT and CAS for the DIMM to satisfy a running average power limit equal to the value of $P_{DIMM, target}$ (=Pset in PI control loop 300 of FIG. 3). Mathematically, this may be expressed as setting limits on CAS and ACT so that $\Sigma P/N=P_{DIMM, target}$ for time intervals 1 to N. Finally, once the DIMM's workload yields a lower temperature than $T_{DIMM}$, less an additional temperature cushion $T_{HYST}$ to account for hysteresis (lag time of the DIMM's temperature response), e.g., when $T_{DIMM} \leq T_{LIMIT}-T_{HYST}$, the memory controller removes the CAS and ACT limits.

Figure 5:
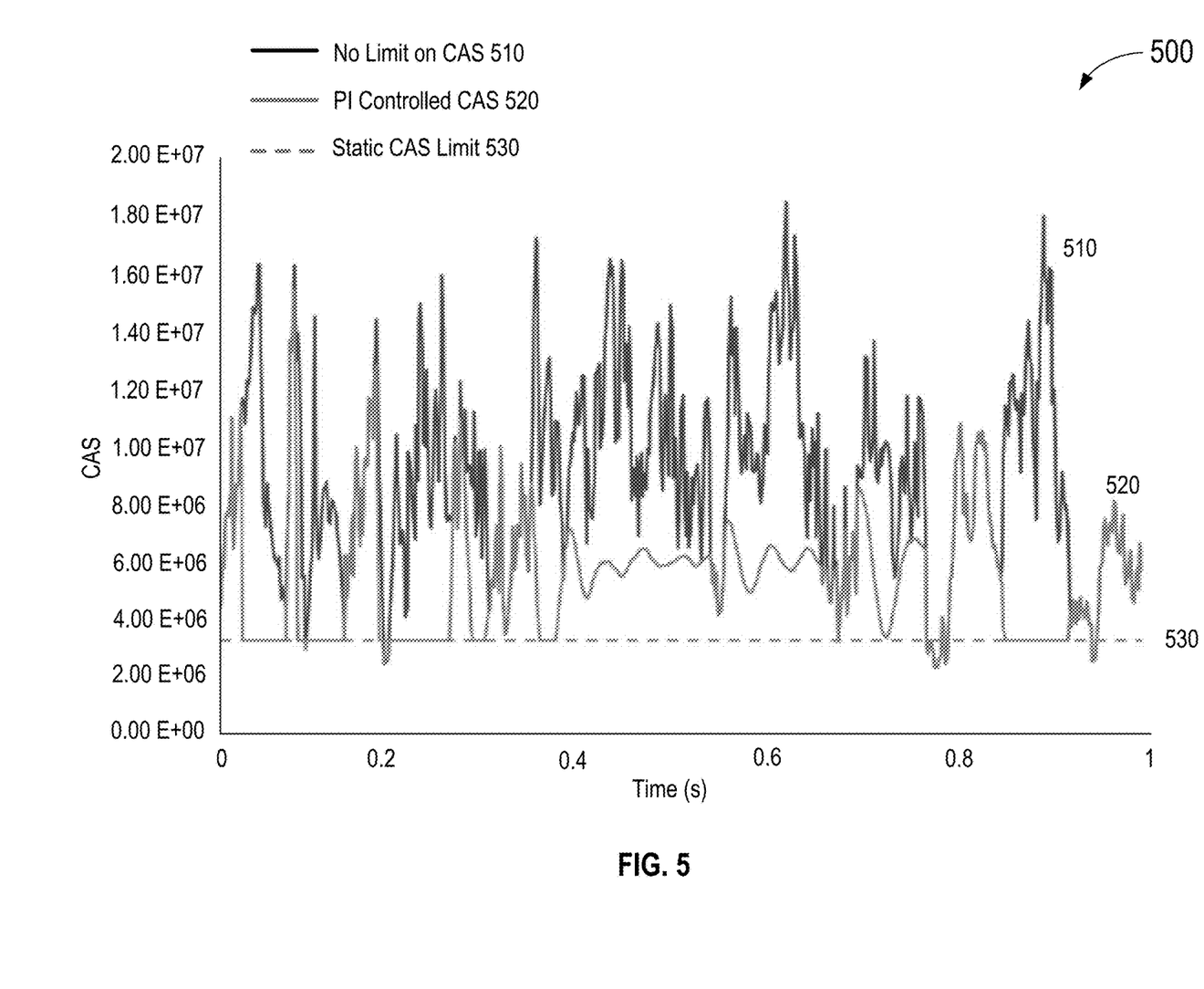
FIG. 5 presents a comparison of several plots of bandwidth versus time for an example memory module for each of: un-throttled bandwidth, bandwidth controlled in accordance with various embodiments, and bandwidth controlled by conventional approach.

FIG. 4, next described, illustrates a nested loop PI control algorithm according to various embodiments. FIG. 5 plots a comparison of example results obtained by the inventors using the algorithm of FIG. 4 as compared with each of: conventional bandwidth limiting approaches and no bandwidth limitation.

Conventional bandwidth limitation algorithms use a static ACT and CAS limit programmed into the BIOS. Upon reaching the temperature threshold $T_{LIMIT}$, the BIOS limits ACT and CAS and waits until the temperature falls back down below the threshold plus an additional hysteresis temperature interval, or below $\{T_{LIMIT}-T_{HYST}\}$. Additionally, many conventional algorithms require a memory controller to wait at least 125 ms to turn off the static ACT and CAS limits. This is because the temperature time constant is significantly longer than the ACT and CAS power time constant.

FIG. 4 illustrates a combination 400 of the two PI control loops described above with reference to FIGS. 2 and 3. With reference to FIG. 4, the two nested control loops include outer PI control loop 401, corresponding to FIG. 2, which dynamically relates DIMM power to temperature, and inner PI control loop 403, corresponding to FIG. 3, which dynamically relates a DIMM bandwidth limit to the DIMM power of the outer loop (corresponding to FIG. 2). Because each PI control loop was described above, the details specific to each of the loops need not be repeated.

Continuing with reference to FIG. 4, beginning at the far left of the figure, Tset 410 is input. As noted above, the actual value of Tset may depend, for example, on the type and workload of the DIMM, and may be set by a DIMM manufacturer. In particular, Tset is input to summing node 411, where the error function for the temperature, e(t)=Tset−T(t) is calculated. Next, e(t) is input to each of the proportional 420, and the integral 420A, arms of outer loop 401. The outputs of each of these arms are then summed at summing node 423 to yield Pset 413. At this point the outer loop feeds Pset to the input of inner loop 403 at summing node 417, where the error function for the pressure value, e(t)=Pset−P(t) is calculated. Next, e(t), the error function for DIMM power, is input to each of the proportional 425, and the integral 425A, arms of inner loop 403. The outputs of each of these arms are then summed, at summing node 427, to yield either CAS(t), as shown, or ACT(t) (not shown, but indicated by the asterisk at 427) the bandwidth control variables.

Continuing with reference to FIG. 4, CAS(t) is then input to DIMM Power response 440, which outputs P(t) at 450. P(t) is fed back into inner loop summing node 417, where e(t)=Pset−P(t) is again calculated, using Pset 413 from the outer loop, to iterate another run through inner loop 403. Additionally, P(t) at 450 is also fed back into DIMM thermal response 441 of outer loop 401, to yield T(t) 460, the process variable of outer loop 401, which is then fed back into summing node 411 of outer loop 401, for another iteration.

Thus, in embodiments, the nested PI control loop algorithm, which, in the inner loop associates ACT/CAS to DIMM power, allows a memory controller to dynamically adjust to a workload and thermal environment of the DIMM by computing the appropriate ACT and CAS limits based on a power target for the particular thermal environment.

FIG. 5, next described, illustrates a comparison of operating bandwidth results for three separate cases, using the same example DIMM: conventional control methods, the control algorithm of FIG. 4, and no bandwidth limits at all. The data shown in FIG. 5 is form a one second test, as shown by the time axis. With reference to FIG. 5, upper trace 510 is for a non-limited DIMM. No limit was placed on CAS. Trace 520 is for the control algorithm of FIG. 4, and trace 530 is for the conventional method—a static CAS limit to 10% of total bandwidth. Thus, FIG. 5 illustrates how dynamically modulating CAS over a period of one second achieved greater overall CAS commands than a simple 10% hammer method. For the full one second interval shown in FIG. 5, conventional static CAS throttling achieved a total of $1.8 \times 10^9$ CAS commands, while power-based dynamic PI throttling according to various embodiments achieved a total of $3.0 \times 10^9$ CAS commands, a 66% improvement in DIMM bandwidth during a throttling event.

Figure 6:
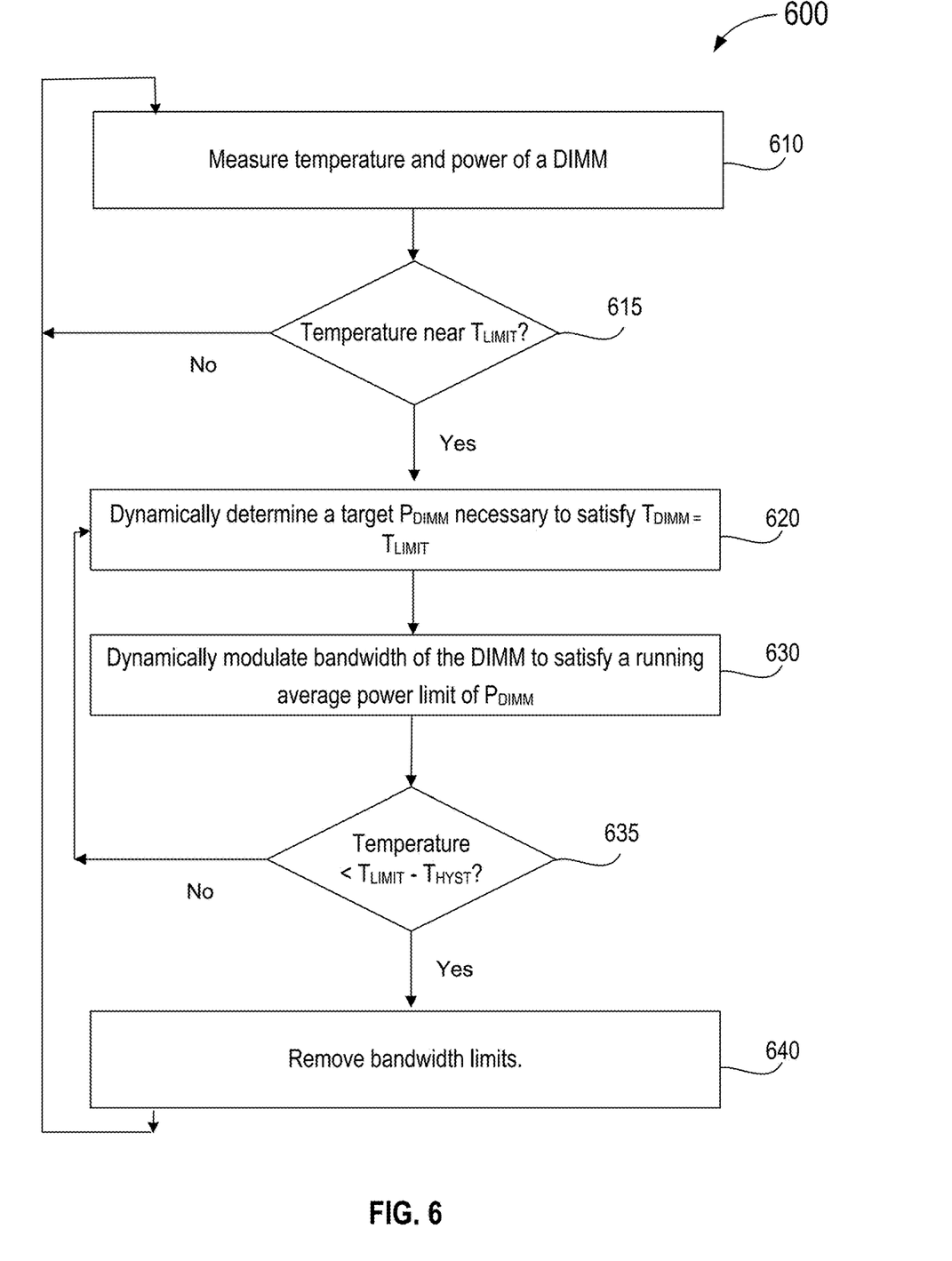
FIG. 6 illustrates an overview of the operational flow of a process for dynamically controlling bandwidth of a memory module, in accordance with various embodiments.

Referring now to FIG. 6, an overview of the operational flow of a process 600 for dynamically controlling the temperature of a DIMM, in accordance with various embodiments, is presented. Process 600 implements the nested PI control loops of FIG. 4, and, in embodiments, may be performed by memory controller 120 of FIG. 1, for example, via PIC 123. Process 600 includes blocks 610 through 640. In alternate embodiments, process 600 may have more or less operations, and some of the operations may be performed in different order.

Figure 7:
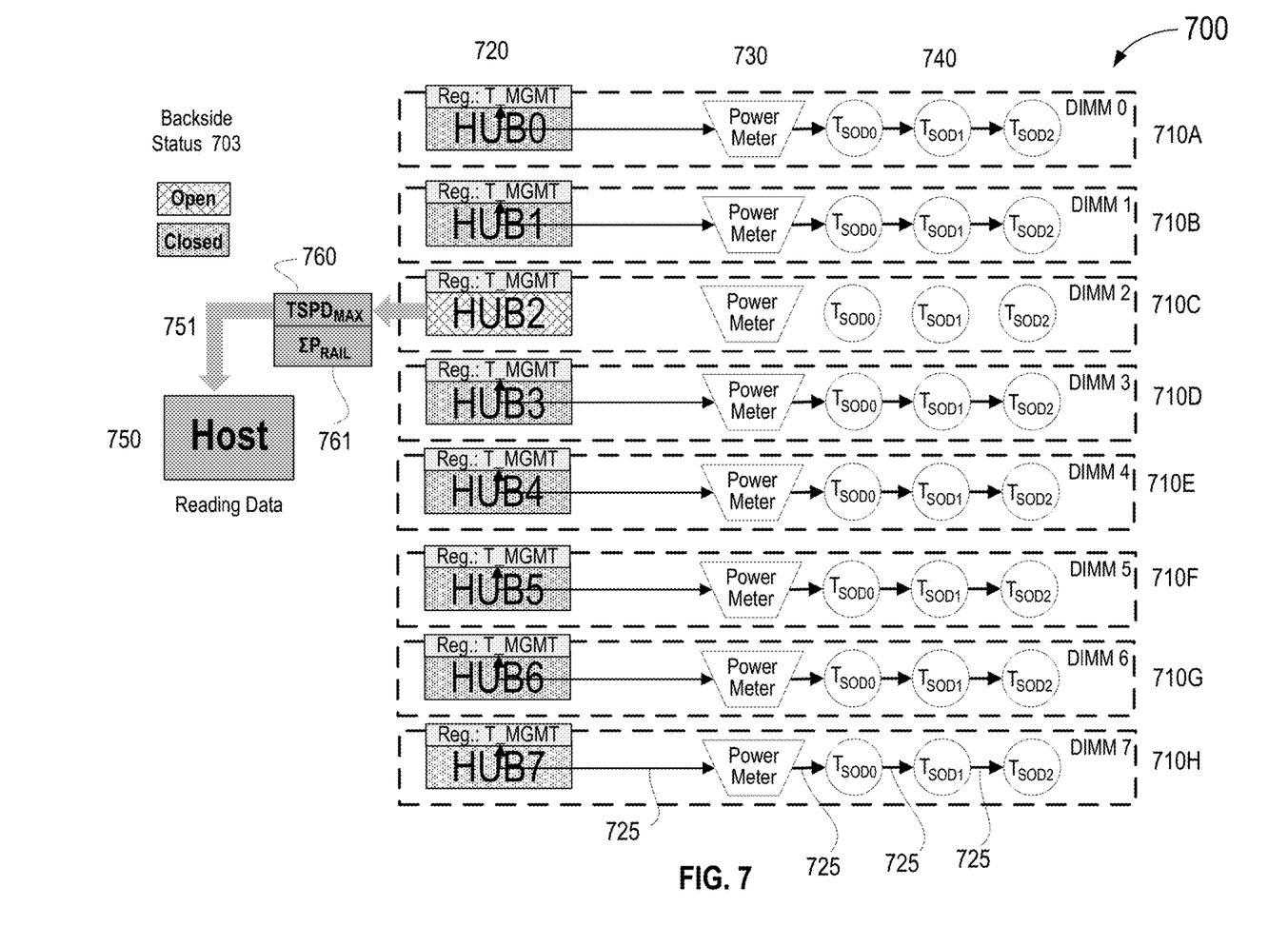
FIG. 7 illustrates reading sensor data from an example multiple DIMM memory where each DIMM is provided with a data consolidation hub, in accordance with various embodiments.

Process 600 begins at block 610, where the memory controller measures temperature and power of a given DIMM, such as, for example, DIMM 150 of FIG. 1. For example, sensor poller 127 of memory controller 120 may measure these values from temperature and power sensors 125 of DIMM 150. Alternatively, where the DIMM has an integrated consolidated data hub, such as hub 720 of FIG. 7 (or, for example, sensor data hub 945 of FIG. 9), the controller may read these values out of hub registers, as shown in FIG. 7 and described below, rather than polling each of the individual temperature and power sensors of the DIMM.

From block 610, process 600 proceeds to query block 615, where the memory controller determines if the temperature of the DIMM is near $T_{LIMIT}$, a maximum operating temperature value, set, for example, by the manufacturer. If the return is "No" at query block 615, process 600 returns to block 610 and begins again. If, however, query block 615 returns "Yes", then process 600 moves to block 620, where the memory controller dynamically determines a target $P_{DIMM}$ necessary to satisfy $T_{DIMM}=T_{LIMIT}$. As noted above, this determination may be performed using the outer PI control loop of FIGS. 2 and 4, described above, which relates a calculated DIMM power, or Pset, to a temperature set point Tset.

From block 620, process 600 proceeds to block 630, where the memory controller dynamically modulates the bandwidth of the DIMM to satisfy a running average power limit of $P_{DIMM}$. As noted above, this determination may be performed using the inner PI control loop of FIGS. 3 and 4, described above, which relates CAS commands per unit time, or, alternatively, ACT commands per unit time, to DIMM power, Pset. Using these values, the memory controller then modulates the DIMM bandwidth by imposing the determined limits for one or both of CAS(t) and ACT(t).

From block 630, process 600 proceeds to query block 635, where the controller determines if the DIMM temperature has dropped a sufficient amount such that the bandwidth limits on CAS and ACT may be removed. In embodiments, the required drop may be a bit below $T_{LIMIT}$, by an additional amount $T_{HYST}$, to account for the hysteresis lag in the DIMM's temperature response to bandwidth (and thus power) limits. If "No" is returned at query block 635, the temperature has not sufficiently yet dropped, and process 600 returns to block 620, and continues to implement the dynamic modulation of the DIMM. If, however, query block 635 returns "Yes", then process 600 moves to block 640, where the memory controller removes the bandwidth limits on CAS and/or ACT. As shown, from block 640, process 600 returns to block 610, as process 600 is a continuous one for thermally managing the DIMM.

As shown in FIG. 1, an example memory controller obtains DIMM temperature and power values over a sideband control bus 147. A host computer, when accessing a DIMM to obtain temperature and power values in this way, may consume more bandwidth of a sideband control bus than may be optimal. For example, a DIMM, such as a DDR5, may have three temperature sensors and four power meters. Assume that a host computer accesses each of those sensors at 1 ms intervals, and, for example, further assume that there is an example memory board with 8 DIMMs in total, and that the host computer performs this access for every temperature and power register. Such accesses would likely consume 17% of the sideband control bus bandwidth between the host computer and system memory. Moreover, such a high use of the available bandwidth may very likely impinge upon scheduling of other commands on the bus.

One possible solution to this problem can be to sample the various registers of each DIMM at a reduced rate, to decrease the chance of creating scheduling issues. However, sampling the registers at lower rates can limit the ability of the system to respond to thermal events in a timely manner. Thus, in embodiments, in order to adequately sample temperature and power data of a DIMM, so as to run the PI control algorithm of FIGS. 2-4, above, and at the same time not to overburden sideband control bus bandwidth, a memory module is provided with a data consolidation hub, which is a device provided in a serial presence detect (SPD) chip on a memory module.

In embodiments, the hub is used to consolidate the temperature and power data of each memory module, for example, a DIMM. An SPD chip on a memory module is an additional chip typically holding a certain number of bytes of information about the module. For example, in some embodiments an SPD holds 128 bytes of Hex data. The SPD stored information identifies the memory module to the BIOS during a power on self-test (POST), so that the motherboard is advised of its characteristics, as well as the timings that can be used with the module.

In embodiments, a data consolidation hub acts as an intermediary for sensor data between a host and a DIMM. In embodiments, it obtains temperature values from all of the temperature sensors on a DIMM, but only stores the maximum temperature value for reporting to the host. This is because even if one temperature sensor of a memory module approaches, or exceeds $T_{LIMIT}$, this is a potentially dangerous condition, and bandwidth limitation as described above needs to be imposed. In addition, in embodiments, a data consolidation hub sums up all of the power rails on a DIMM, and stores the total power for reporting to the host. Additionally, in embodiments, the data consolidation hub may average the total power over some time interval, and only store a value for the average total power, e.g., over a one millisecond (1 ms) period, and report that average total value to the host. In embodiments, a memory controller of a host, for example, instead of polling each of the various separate temperature and power sensors of the DIMM, need only request the consolidated temperature and power values of the DIMM directly from the hub, thereby reducing the number of DIMM registers required to be read by the host.

Accordingly, for example, in a DIMM with three temperature sensors, and four power rails, in embodiments, a hub with only two registers stores all necessary temperature and power data for the DIMM. These registers store a maximum temperature of the three temperature sensors, and a total power, or total average power, of the four power rails. In embodiments, this may reduce the sensor data traffic from, for example, 14%, to 4% of the available sideband bus bandwidth. In embodiments, in order for this to happen on the same bus, the hub acts as a bridge between the sideband bus and a "backside" of the sideband bus where the DIMM components may be isolated. The backside of the sideband bus on the DIMM thus refers to the circuitry on the DIMM that may be disconnected by the hub from the part of the sideband bus that communicates with the host. In addition to isolating the backside on a DIMM, as noted above, in embodiments the hub can individually manage the DIMM's temperature sensors and power meters, saving bandwidth on the bus. The example figures provided above for register count, both on the DIMM and the hub, are merely exemplary, and a DIMM and its hub may gave more, or less, temperature sensors, power rails and hub registers.

As an example, FIG. 7 illustrates a memory board with eight DIMMs, 710A through 710H, each DIMM having three temperature registers 740 and a power meter 730. Additionally, in the depicted example, each DIMM is provided with a hub 720, and, as noted, each DIMM has a backside, which may be opened or closed by the hub 720 of that respective DIMM. The number of DIMMs in this example, as well as the number of sensors on each DIMM, and the number of registers provided in the hub, are for illustration purposes only and smaller, or lesser, numbers may be used. Continuing with reference to FIG. 7, the respective hubs for DIMMs 710A through 710H are labeled HUB0 through HUB7. The backside of only one DIMM may be open at any one time for reading, and it is that DIMM whose sensor data is read by the host at that time. Thus, for any DIMM not currently being read, its hub continues to collect sensor information from its sensors 730 and 740. In the example DIMMs of FIG. 7, backside status 703 of a DIMM is indicated as "closed" by shading, and as "open" by cross hatching. Thus, the backside of DIMM 710C has been opened by its hub, HUB2, and therefore the registers of HUB2 may be read by host 750 over sideband bus 751. As shown, the hub registers include a temperature register $TPSD_{MAX}$ 760 which stores the maximum temperature of the three temperature registers, $T_{SOD0}$, $T_{SOD1}$, $T_{SOD2}$ of each DIMM, and a power register $\Sigma P_{RAIL}$ 761, that stores an average of the sum of all power rails of the DIMM (collectively shown schematically, in FIG. 7, as "Power Meter" 730 on each DIMM).

In embodiments, each hub initially collects temperature and power data from its DIMM, averages total power over a 1 ms time interval, and updates a maximum temperature value based on subsequent reads. Thus, in embodiments, at any given time, a hub 720 stores a value for average power and maximum temperature for its DIMM. Then, in response to a DIMM address broadcast from the host computer for a desired sensor data read, such as, in FIG. 7, an address that identifies DIMM 710C, the hub responds to the host, and indicates it is available. Additionally, if the hub is then actively performing a read of temperature or power on its DIMM, it first completes its read. Then, in embodiments, the hub does at least one of the following tasks: opens the backside of the DIMM, provides the average power of the DIMM to the host, or provides the DIMM's maximum temperature to the host. In alternate embodiments, there may be more or less tasks the hub may perform in response to a host's signal, and some of the tasks may be performed in different order.

In embodiments, after reading the data from the hub, the host may send an end read signal to the hub. Upon receipt of the end read signal, for example, the hub may do one of the following tasks: close the backside, reset the average power register, or reset the maximum temperature. In alternate embodiments, there may be more or less tasks the hub may perform in response to the host's ending signal, and some of the tasks may be performed in different order. In FIG. 7, the register labeled "Reg. T_MGMT" refers to either the DIMM's maximum temperature or its averaged power stored by the hub.

Figure 8:
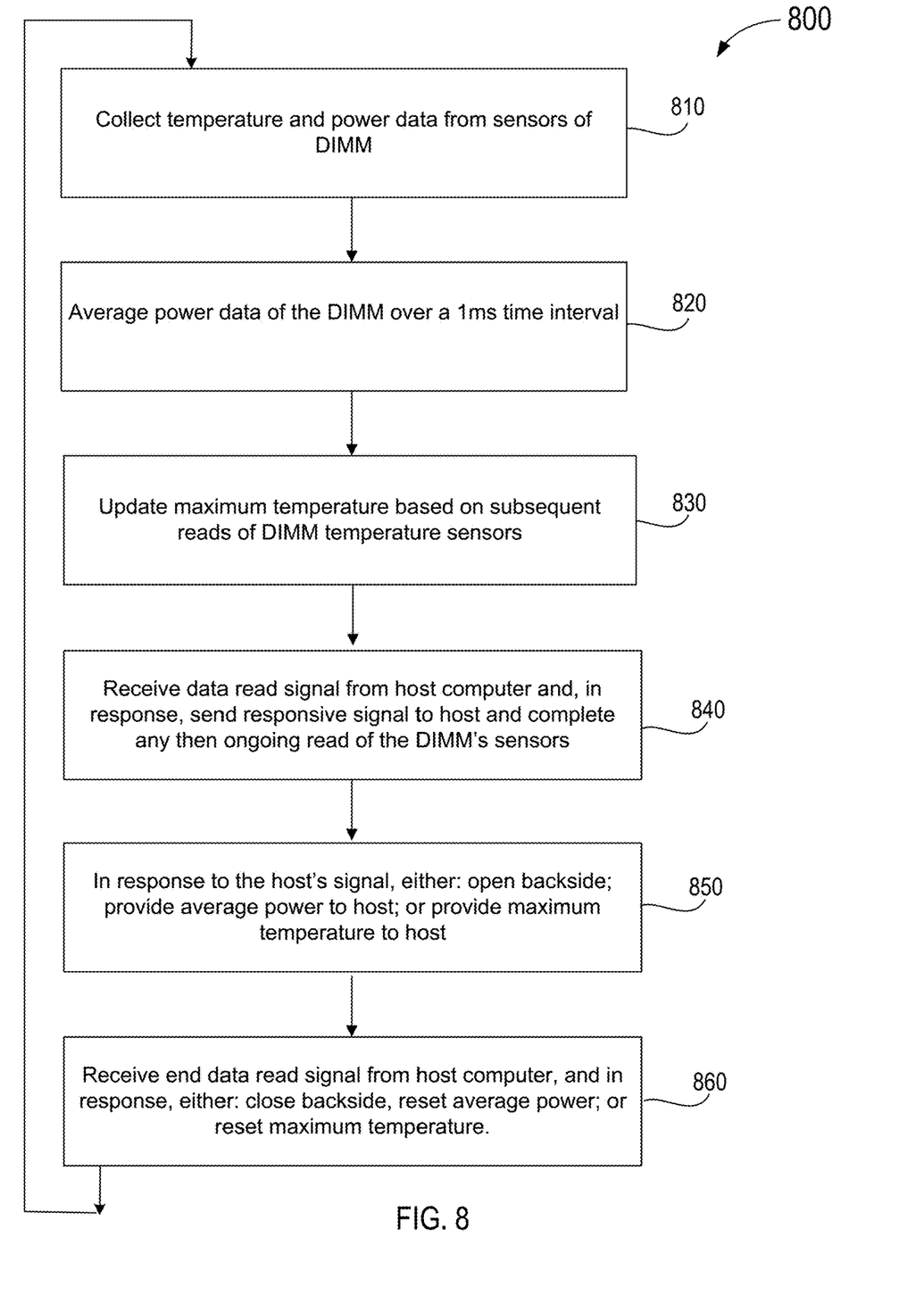
FIG. 8 illustrates an overview of the operational flow of a process for reading sensor data from an example multiple-DIMM module, in accordance with various embodiments.
Figure 9:
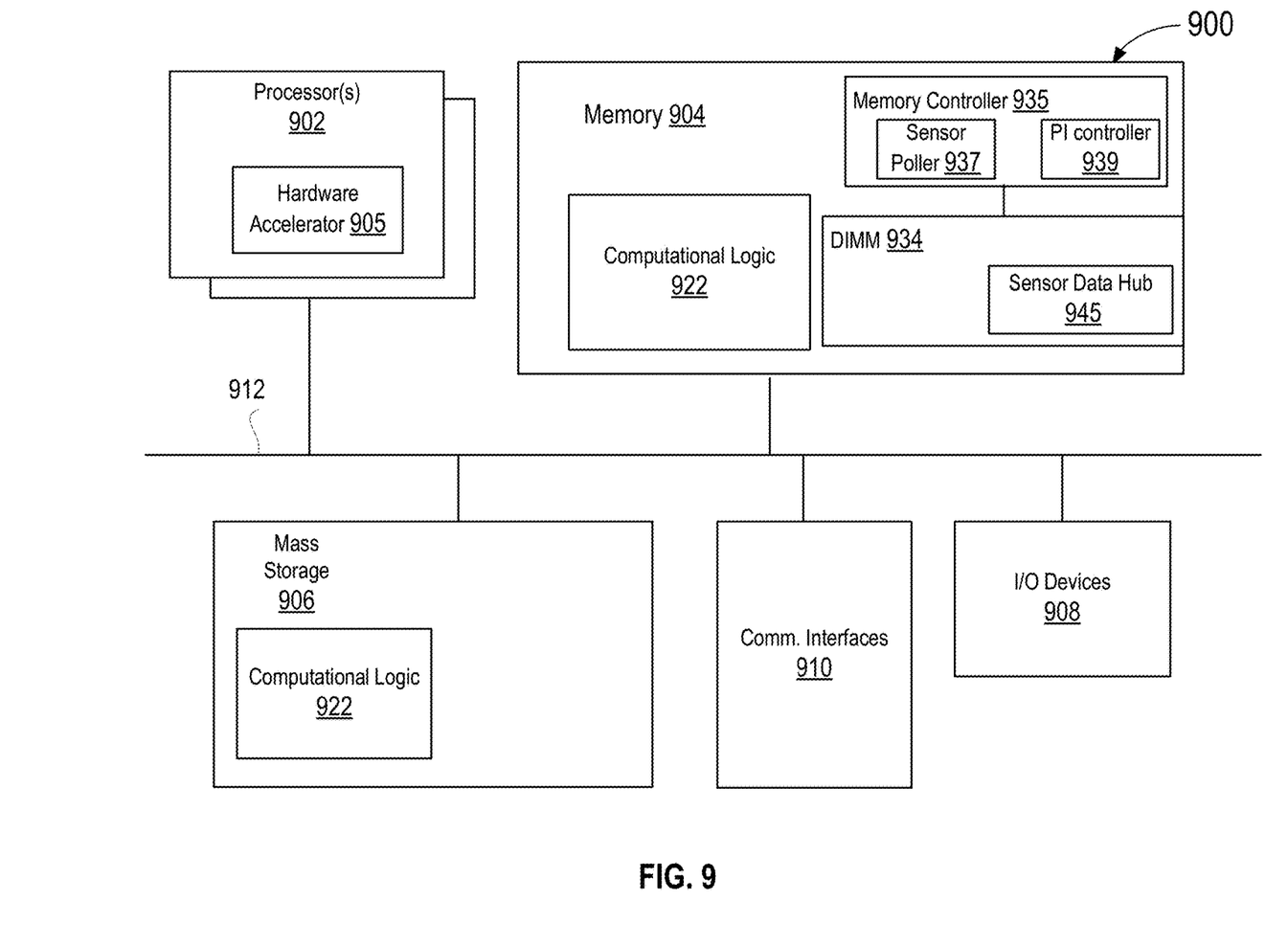
FIG. 9 illustrates a block diagram of a computer device suitable for practicing the present disclosure, in accordance with various embodiments.

Referring now to FIG. 8, an overview of the operational flow of a process 800 for collecting temperature and power data for a DIMM, and providing the data to a host computer coupled to the DIMM, in accordance with various embodiments, is presented. Process 800 may be performed by a data consolidation hub 720 provided in DIMM 710A, both as shown, for example, in FIG. 7 and described above. Or, for example, it may be performed by sensor data hub 945 of DIMM 934, as shown in FIG. 9. Process 800 includes blocks 810 through 860. In alternate embodiments, process 800 may have more or less operations, and some of the operations may be performed in different order.

Process 800 begins at block 810, where the hub collects temperature and power data from its DIMM's sensors. For example, hub 720 polls each of power meter 730, and temperature sensors 740 on DIMM 710A of FIG. 7. From block 810, process 800 proceeds to block 820, where the hub averages power data for the DIMM over a 1 ms time interval, and stores the average value in its power register. From block 820, process 800 proceeds to block 830, where the hub updates the stored maximum temperature value for the DIMM based on subsequent reads of the temperature sensors 740 of the DIMM, one of DIMMs 710A through 710H. (Although process 800 is described for one example hub, process 800 is be performed by every hub 720, for it respective one of DIMMs 710, as shown in FIG. 7).

From block 830, process 800 proceeds to block 840, where the hub receives a data read signal from a host computer, such as, for example, host 750, as shown in FIG. 7, or processor 105 (via memory controller 120) as shown in FIG. 1. In embodiments, the signal includes an address identifying a particular DIMM, and indicates that the host wants to read the data for that DIMM from the hub's registers. For example, the signal may be sent by host 750 of FIG. 7, or by sensor poller 127 of memory controller 120, as shown in FIG. 1, to obtain temperature and power sensor data of a DIMM.

In response to the host's data read signal, in embodiments, the hub sends a responsive signal, and, prior to opening the DIMM's backside so that the host can read the hub's data registers, the hub first completes any then current sensor read of its DIMMs sensors, such as, for example, sensors 730 and 740 as shown in FIG. 7. This is because, in embodiments, each hub continually updates the (maximum) temperature and average power values it stores in its registers, by reading the relevant sensors of the DIMM, when the backside is not open. Thus, any hub may be in the middle of reading its DIMM's sensors when it receives the host's data read signal. Open communication between a hub and its DIMM's sensors is illustrated in FIG. 7 by the solid two-way arrows 725 (they are drawn in for HUB7, of DIMM 710H, but apply to each DIMM) connecting registers T_MGMT of each hub with each of that hub's respective DIMM's sensors, namely example power meter 730 and the three example temperature sensors 740, as shown for each of DIMMs 710A, 710B and 710D through 710H. As also shown in FIG. 7, HUB2 of DIMM 710C, which has already opened its backside in response to receiving an address identifying DIMM 710C from host 750 (the open backside status indicated in FIG. 7 by the cross-hatching), no longer has open communications between its registers "T_MGMT" and the sensors of DIMM 710C, indicated by the absence of the solid two-way arrow in DIMM 710C. Rather, registers "T_MGMT" of HUB2 are now in communications with host 750, as shown. Thus, prior to opening the backside of DIMM so that the host can read its registers, HUB2 would have completed any sensor reads of sensors 730 and 740 of DIMM 710C, as per block 840. Once a hub opens the DIMM's backside, it has open communications with the host, over bus 751, as is shown for the case of HUB2, in FIG. 7.

From block 840, process 800 proceeds to block 850, where, in response to receiving the host's signal, the hub may, for example, perform any of three tasks: open its backside; provide average power data for the DIMM to the host; or provide maximum temperature data for the DIMM to the host. For example, as shown in FIG. 7, HUB2 has opened the backside of DIMM 710C, indicated by the "open" backside status cross-hatching, and host 750 may now read its registers "T_MGMT."

From block 850, process 800 proceeds to block 860, where the hub receives an end data read signal from the host computer, signaling that the host is done accessing sensor data from that DIMM. In response, the hub may perform, for example, any of three tasks: close the DIMM's backside; reset average power; or reset maximum temperature. Finally, from block 860, process 800 returns to block 810, where the hub continues to collect temperature and power data from its DIMM.

Referring now to FIG. 9 wherein a block diagram of a computer device suitable for practicing the present disclosure, in accordance with various embodiments, is illustrated. As shown, computer device 900 may include one or more processors 902, memory controller 903, and system memory 904. Each processor 902 may include one or more processor cores, and hardware accelerator 905. An example of hardware accelerator 905 may include, but is not limited to, programmed field programmable gate arrays (FPGA). In embodiments, processor 902 may also include a memory controller (not shown). In embodiments, system memory 904 may include any known volatile or non-volatile memory, including, for example, DIMM 934, which may include sensor data hub 945. DIMM 934 may be controlled by memory controller 935. Alternatively, memory controller 935 may be provided in processor 902 (not shown). In embodiments, memory controller 935 may include sensor poller 937 and PI controller 939. PI controller 939 may dynamically thermally manage DIMM 934 using a nested PI loop control algorithm, as described above with reference to FIGS. 2-4.

Additionally, computer device 900 may include mass storage device(s) 906 (such as SSDs 909), input/output device interface 908 (to interface with various input/output devices, such as, mouse, cursor control, display device (including touch sensitive screen), and so forth) and communication interfaces 910 (such as network interface cards, modems and so forth). In embodiments, communication interfaces 910 may support wired or wireless communication, including near field communication. The elements may be coupled to each other via system bus 912, which may represent one or more buses. In the case of multiple buses, they may be bridged by one or more bus bridges (not shown).

System memory 904 and mass storage device(s) 906 may be employed to store a working copy and a permanent copy of the executable code of the programming instructions of an operating system, one or more applications, and/or various software implemented components of processor 105, memory controller 120, sensor poller 127, PI controller 123, all of FIG. 1, or of outer PI control loop 200 of FIG. 2, inner PI control loop 300 of FIG. 3, or nested PI control loop 400 of FIG. 4, collectively referred to as computational logic 922. The programming instructions implementing computational logic 922 may comprise assembler instructions supported by processor(s) 902 or high-level languages, such as, for example, C, that can be compiled into such instructions. In embodiments, some of computing logic may be implemented in hardware accelerator 905. In embodiments, part of computational logic 922, e.g., a portion of the computational logic 922 associated with the runtime environment of the compiler may be implemented in hardware accelerator 905.

The permanent copy of the executable code of the programming instructions or the bit streams for configuring hardware accelerator 905 may be placed into permanent mass storage device(s) 906 and/or hardware accelerator 905 in the factory, or in the field, through, for example, a distribution medium (not shown), such as a compact disc (CD), or through communication interface 910 (from a distribution server (not shown)). While for ease of understanding, the compiler and the hardware accelerator that executes the generated code that incorporate the predicate computation teaching of the present disclosure to increase the pipelining and/or parallel execution of nested loops are shown as being located on the same computing device, in alternate embodiments, the compiler and the hardware accelerator may be located on different computing devices.

The number, capability and/or capacity of these elements 910-912 may vary, depending on the intended use of example computer device 900, e.g., whether example computer device 900 is a smartphone, tablet, ultrabook, a laptop, a server, a set-top box, a game console, a camera, and so forth. The constitutions of these elements 910-912 are otherwise known, and accordingly will not be further described.

Figure 10:
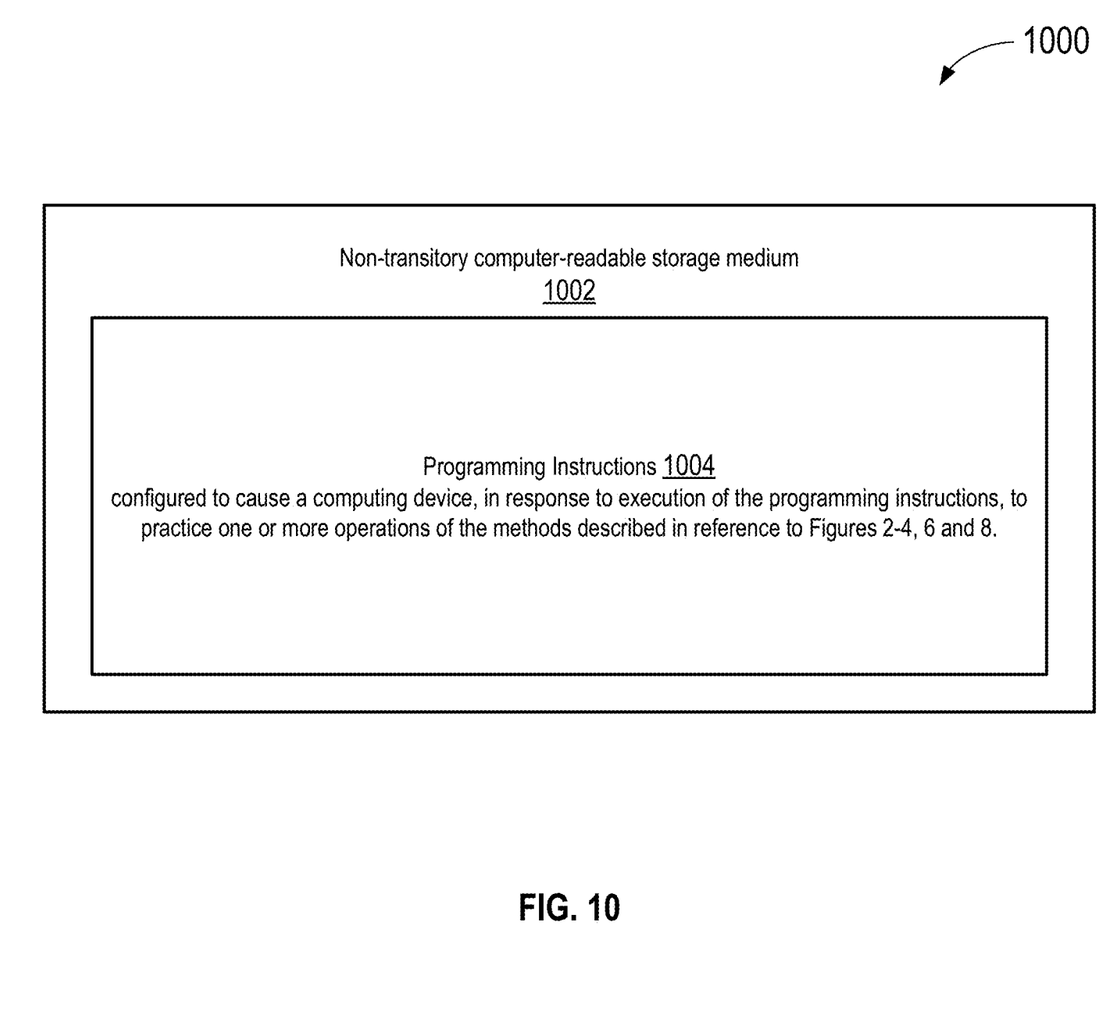
FIG. 10 illustrates an example computer-readable storage medium having instructions configured to practice aspects of the processes of FIGS. 2-4, 6 and 8, in accordance with various embodiments.

FIG. 10 illustrates an example computer-readable storage medium having instructions configured to implement all (or portion of) software implementations of processor 105, memory controller 120, sensor poller 127, and PI controller 123, all of FIG. 1, or of outer PI control loop 200 of FIG. 2, inner PI control loop 300 of FIG. 3, nested PI control loop 400 of FIG. 4, and/or practice (aspects of) processes 600 of FIG. 6 and 800 of FIG. 8, earlier described, in accordance with various embodiments. As illustrated, computer-readable storage medium 1002 may include the executable code of a number of programming instructions or bit streams 1004. Executable code of programming instructions (or bit streams) 1004 may be configured to enable a device, e.g., computer device 1000, in response to execution of the executable code/programming instructions (or operation of an encoded hardware accelerator 1075), to perform (aspects of) processes performed by processor 105, memory controller 120, sensor poller 127, and PI controller 123, all of FIG. 1, or of outer PI control loop 200 of FIG. 2, inner PI control loop 300 of FIG. 3, nested PI control loop 400 of FIG. 4, and/or practice (aspects of) processes 600 of FIG. 6 and 800 of FIG. 8. In alternate embodiments, executable code/programming instructions/bit streams 1004 may be disposed on multiple non-transitory computer-readable storage medium 1002 instead. In embodiments, computer-readable storage medium 1002 may be non-transitory. In still other embodiments, executable code/programming instructions 1004 may be encoded in transitory computer readable medium, such as signals.

Referring back to FIG. 10, for one embodiment, at least one of processors 1002 may be packaged together with a computer-readable storage medium having some or all of computing logic 1022 (in lieu of storing in system memory 1004 and/or mass storage device 1006) configured to practice all or selected ones of the operations earlier described with reference to FIGS. 2, 3, 4, 6 and 8. For one embodiment, at least one of processors 1002 may be packaged together with a computer-readable storage medium having some or all of computing logic 1022 to form a System in Package (SiP). For one embodiment, at least one of processors 1002 may be integrated on the same die with a computer-readable storage medium having some or all of computing logic 1022. For one embodiment, at least one of processors 1002 may be packaged together with a computer-readable storage medium having some or all of computing logic 1022 to form a System on Chip (SoC). For at least one embodiment, the SoC may be utilized in, e.g., but not limited to, a hybrid computing tablet/laptop.

Illustrative examples of the technologies disclosed herein are provided below. An embodiment of the technologies may include any one or more, and any combination of, the examples described below.

EXAMPLES

Example 1 is a memory controller (MC), comprising: a sensor poller to obtain a temperature and a power of a memory module (MM) operated by the MC; and a proportional integral controller (PIC), coupled to the sensor poller, to: dynamically set at least one bandwidth limit for the MM, based, at least in part, on a relationship between a temperature of the MM, a power of the MM and a bandwidth of the MM, wherein the dynamically set bandwidth limit defines the power of the MM at which the MM operates for a predetermined temperature limit (Tlimit).

Example 2 is the MC of example 1, and/or any other example herein, wherein the at least one bandwidth limit is one or both of: a maximum column access strobe (CAS) rate performed by the MM, or a maximum row activation (ACT) rate performed by the MM.

Example 3 is the MC of example 1, and/or any other example herein, wherein the MM is a DDR5 dual in-line memory module (DIMM).

Example 4 is the MC of example 1, and/or any other example herein, wherein the sensor poller is further to periodically obtain at least one temperature of the MM and at least one power of the MM to dynamically set the at least one bandwidth limit.

Example 5 is the MC of example 4, and/or any other example herein, wherein the at least one temperature and the at least one power are each read out of at least one register of the MM.

Example 6 is the MC of example 4, and/or any other example herein, wherein the temperature is a maximum temperature of the MM and the power is an average total power of the MM, each read out of a register of a data consolidation hub of the MM.

Example 7 is the MC of example 1, and/or any other example herein, wherein the PIC uses an algorithm comprising two nested PI control loops to set the at least one bandwidth limit.

Example 8 is the MC of example 7, and/or any other example herein, wherein the nested PI control loops include an outer PI control loop that relates a power of the MM to Tlimit, and an inner control loop that relates a bandwidth limit variable to the power of the MM.

Example 9 is the MC of example 7, and/or any other example herein, wherein: the sensor poller is further to successively obtain each of the temperature and the power of the MM at a pre-defined sample rate, and the PIC is further to set the at least one bandwidth limit to obtain a running average power value of the MM equal to a power set point that is dynamically determined by the algorithm.

Example 10 is the MC of example 1, and/or any other example herein, wherein the PIC is further to determine if the temperature of the MM has fallen below a pre-defined temperature below Tlimit, and, in response to the determination, remove the at least one bandwidth limit.

Example 11 is the MC of example 1, and/or any other example herein, wherein the MM is a DIMM comprising a data consolidation hub coupled to multiple temperature sensors and multiple power rails of the DIMM, the hub storing an average total value of the power rails, and a maximum value of the temperature sensors, and wherein: the sensor poller is further to receive a DIMM maximum temperature from a first register of the data consolidation hub, and a DIMM average total power from a second register of the data consolidation hub, and the PIC is further to use the temperature and power values received from the data consolidation hub to dynamically set at least one bandwidth limit for the DIMM.

Example 12 is one or more non-transitory computer-readable storage media comprising a set of instructions, which, when executed by a MC operating a MM of a computing device, cause the MC to: obtain a temperature and a power of the MM; and dynamically set at least one bandwidth limit for the MM, based, at least in part, on a relationship between a temperature of the MM, a power of the MM and a bandwidth of the MM, wherein the dynamically set bandwidth limit defines the power of the MM at which the MM operates for a predetermined temperature limit (Tlimit).

Example 13 is the one or more non-transitory computer-readable storage media of example 12, and/or any other example herein, wherein the at least one bandwidth limit is one or both of: a maximum number of column access strobes (CASs) or a maximum number of row activations (ACTs), per unit time.

Example 14 is the one or more non-transitory computer-readable storage media of example 12, and/or any other example herein, wherein the instructions, when executed, further cause the MC to periodically obtain at least one temperature value of the MM, and at least one power value of the MM, to dynamically set the at least one bandwidth limit.

Example 15 is the one or more non-transitory computer-readable storage media of example 12, and/or any other example herein, wherein the instructions, when executed, further cause the MC to read each of the at least one temperature and the at least one power of the MM out of a register of the MM.

Example 16 is the one or more non-transitory computer-readable storage media of example 12, and/or any other example herein, wherein the instructions, when executed, further cause the MC to use an algorithm comprising two nested PI control loops to set the at least one bandwidth limit, wherein the nested PI control loops include an outer PI control loop that relates a power of the MM to Tlimit, and an inner control loop that relates a bandwidth limit variable to the power of the MM.

Example 17 is the one or more non-transitory computer-readable storage media of example 16, and/or any other example herein, wherein the instructions, when executed, further cause the MC to: set the at least one bandwidth limit to obtain a running average power of the MM equal to a power set point dynamically determined by the algorithm.

Example 18 is a system, comprising: a MM; and a PIC to thermally manage the MM, the PIC to: dynamically set at least one bandwidth limit for the MM, based, at least in part, on a relationship between a temperature of the MM, a power of the MM and a bandwidth of the MM, wherein the dynamically set bandwidth limit defines the power of the MM at which the MM operates for a predetermined temperature limit (Tlimit).

Example 19 is the system of example 18, and/or any other example herein, wherein: the at least one bandwidth limit is one or both of: a maximum column access strobe (CAS) rate performed by the MM, or a maximum row activation (ACT) rate performed by the MM, and wherein the PIC uses an algorithm comprising two nested PI control loops to set the at least one bandwidth limit.

Example 20 is the system of example 19, and/or any other example herein, wherein the nested PI control loops include an outer PI control loop that relates a power of the MM to Tlimit, and an inner control loop that relates a bandwidth limit variable to the power of the MM.

Example 21 is an apparatus for computing, comprising: means for polling sensors to obtain a temperature and a power of a memory module (MM) operated by the apparatus for computing; and means for proportional integral controlling, coupled to the means for polling sensors, to: dynamically set at least one bandwidth limit for the MM, based, at least in part, on a relationship between a temperature of the MM, a power of the MM and a bandwidth of the MM, wherein the dynamically set bandwidth limit defines the power of the MM at which the MM operates for a predetermined temperature limit (Tlimit).

Example 22 is the apparatus for computing of example 21, and/or any other example herein, wherein the at least one bandwidth limit is one or both of: a maximum column access strobe (CAS) rate performed by the MM, or a maximum row activation (ACT) rate performed by the MM.

Example 23 is the apparatus for computing of example 21, and/or any other example herein, wherein the MM is a DDR5 dual in-line memory module (DIMM).

Example 24 is the apparatus for computing of example 21, and/or any other example herein, wherein the means for polling sensors is further to periodically obtain at least one temperature of the MM and at least one power of the MM to dynamically set the at least one bandwidth limit.

Example 25 is the apparatus for computing of example 24, and/or any other example herein, wherein the at least one temperature and the at least one power are each read out of at least one register of the MM.

Example 26 is a method, comprising: obtaining a temperature and a power of a MM of a computing system; and dynamically setting at least one bandwidth limit for the MM, based, at least in part, on a relationship between a temperature of the MM, a power of the MM and a bandwidth of the MM, wherein the dynamically set bandwidth limit defines the power of the MM at which the MM operates for a predetermined temperature limit (Tlimit).

Example 27 is the method of example 26, and/or any other example herein, wherein the at least one bandwidth limit is one or both of: a maximum number of column access strobes (CASs) or a maximum number of row activations (ACTs), per unit time.

Example 28 is the method of example 26, and/or any other example herein, further comprising periodically obtaining at least one temperature value of the MM, and at least one power value of the MM, to dynamically set the at least one bandwidth limit.

Example 29 is the method of example 26, and/or any other example herein, further comprising reading each of the at least one temperature and the at least one power of the MM out of a register of the MM.

Example 30 is the method of example 26, and/or any other example herein, further comprising using an algorithm comprising two nested PI control loops to set the at least one bandwidth limit, wherein the nested PI control loops include an outer PI control loop that relates a power of the MM to Tlimit, and an inner control loop that relates a bandwidth limit variable to the power of the MM.

What is claimed is:

1. A memory controller (MC), comprising:
    a sensor poller to obtain a temperature and a power of a memory module (MM) operated by the MC; and
    a proportional integral controller (PIC), coupled to the sensor poller, to:
        dynamically set at least one bandwidth limit for the MM, based, at least in part, on a relationship between a temperature of the MM, a power of the MM and a bandwidth of the MM,
        wherein the dynamically set bandwidth limit defines the power of the MM at which the MM operates for a predetermined temperature limit (Tlimit),
        wherein the PIC uses an algorithm comprising two nested PI control loops to set the at least one bandwidth limit.

2. The MC of claim 1, wherein the at least one bandwidth limit is one or both of:
    a maximum column access strobe (CAS) rate performed by the MM, or a maximum row activation (ACT) rate performed by the MM.

3. The MC of claim 1, wherein the MM is a DDR5 dual in-line memory module (DIMM).

4. The MC of claim 1, wherein the sensor poller is further to periodically obtain at least one temperature of the MM and at least one power of the MM to dynamically set the at least one bandwidth limit.

5. The MC of claim 4, wherein the at least one temperature and the at least one power are each read out of at least one register of the MM.

6. The MC of claim 4, wherein the temperature is a maximum temperature of the MM and the power is an average total power of the MM, each read out of a register of a data consolidation hub of the MM.

7. The MC of claim 1, wherein the nested PI control loops include an outer PI control loop that relates a power of the MM to Tlimit, and an inner control loop that relates a bandwidth limit variable to the power of the MM.

8. The MC of claim 1, wherein:
the sensor poller is further to successively obtain each of the temperature and the power of the MM at a pre-defined sample rate, and
the PIC is further to set the at least one bandwidth limit to obtain a running average power value of the MM equal to a power set point that is dynamically determined by the algorithm.

9. The MC of claim 1, wherein the PIC is further to determine if the temperature of the MM has fallen below a pre-defined temperature below Tlimit, and, in response to the determination, remove the at least one bandwidth limit.

10. The MC of claim 1, wherein the MM is a DIMM comprising a data consolidation hub coupled to multiple temperature sensors and multiple power rails of the DIMM, the hub storing an average total value of the power rails, and a maximum value of the temperature sensors, wherein:
the sensor poller is further to receive a DIMM maximum temperature from a first register of the data consolidation hub, and a DIMM average total power from a second register of the data consolidation hub, and
the PIC is further to use the temperature and power values received from the data consolidation hub to dynamically set at least one bandwidth limit for the DIMM.

11. One or more non-transitory computer-readable storage media comprising a set of instructions, which, when executed by an MC operating an MM of a computing device, cause the MC to:
obtain a temperature and a power of the MM; and
dynamically set at least one bandwidth limit for the MM, based, at least in part, on a relationship between a temperature of the MM, a power of the MM and a bandwidth of the MM,
wherein the dynamically set bandwidth limit defines the power of the MM at which the MM operates for a predetermined temperature limit (Tlimit),
wherein the at least one bandwidth limit is one or both of: a maximum number of column access strobes (CASs) or a maximum number of row activations (ACTs), per unit time.

12. The one or more non-transitory computer-readable storage media of claim 11, wherein the instructions, when executed, further cause the MC to periodically obtain at least one temperature value of the MM, and at least one power value of the MM, to dynamically set the at least one bandwidth limit.

13. The one or more non-transitory computer-readable storage media of claim 11, wherein the instructions, when executed, further cause the MC to read each of the temperature and the power of the MM out of a register of the MM.

14. The one or more non-transitory computer-readable storage media of claim 11, wherein the instructions, when executed, further cause the MC to use an algorithm comprising two nested PI control loops to set the at least one bandwidth limit, wherein the nested PI control loops include an outer PI control loop that relates a power of the MM to Tlimit, and an inner control loop that relates a bandwidth limit variable to the power of the MM.

15. The one or more non-transitory computer-readable storage media of claim 14, wherein the instructions, when executed, further cause the MC to:
set the at least one bandwidth limit to obtain a running average power of the MM equal to a power set point dynamically determined by the algorithm.

16. A system, comprising:
an MM; and
a PIC to thermally manage the MM, the PIC to:
dynamically set at least one bandwidth limit for the MM, based, at least in part, on a relationship between a temperature of the MM, a power of the MM and a bandwidth of the MM,
wherein the dynamically set bandwidth limit defines the power of the MM at which the MM operates for a predetermined temperature limit (Tlimit), wherein:
the at least one bandwidth limit is one or both of: a maximum column access strobe (CAS) rate performed by the MM, or a maximum row activation (ACT) rate performed by the MM, and wherein the PIC uses an algorithm comprising two nested PI control loops to set the at least one bandwidth limit.

17. The system of claim 16, wherein the nested PI control loops include an outer PI control loop that relates a power of the MM to Tlimit, and an inner control loop that relates a bandwidth limit variable to the power of the MM.

* * * * *